United States Patent [19]
Gallagher et al.

[11] Patent Number: 5,991,193
[45] Date of Patent: Nov. 23, 1999

[54] VOLTAGE BIASING FOR MAGNETIC RAM WITH MAGNETIC TUNNEL MEMORY CELLS

[75] Inventors: William Joseph Gallagher, Ardsley, N.Y.; Roy Edwin Scheuerlein, Cupertino, Calif.

[73] Assignee: International Business Machines Corporation, Armonk, N.Y.

[21] Appl. No.: 08/982,995

[22] Filed: Dec. 2, 1997

[51] Int. Cl.$^6$ .................................................... G11C 11/14
[52] U.S. Cl. ......................................... 365/171; 365/173
[58] Field of Search .................................... 365/171, 173

[56] References Cited

U.S. PATENT DOCUMENTS

| | | | |
|---|---|---|---|
| 5,347,485 | 9/1994 | Taguchi et al. | 365/171 |
| 5,361,226 | 11/1994 | Taguchi et al. | 365/171 |
| 5,448,515 | 9/1995 | Fukami et al. | 365/171 |
| 5,640,343 | 6/1997 | Gallagher et al. | 365/171 |

*Primary Examiner*—David Nelms
*Assistant Examiner*—M. Tran

*Attorney, Agent, or Firm*—Thomas R. Berthold, Esq.; Banner & Witcoff, Ltd.

[57] ABSTRACT

A nonvolatile memory array includes a substrate, a first plurality of electrically conductive traces formed on the substrate, a second plurality of electrically conductive traces formed on the substrate and overlapping the first plurality of traces at a plurality of intersection regions, and a plurality of memory cells formed on the substrate. Each memory cell is located at an intersection region between one of the first plurality of traces and one of the second plurality of traces and includes a bidirectionally conducting nonlinear resistance selection device and a magneto-resistive element electrically coupled in series with the selection device. The array is biased during a read operation by biasing a selected trace of a first plurality of electrically conductive traces at a first bias potential. All other traces of the first plurality of conductive traces are biased at a second bias potential. A selected trace of a second plurality of conductive traces is biased at a third bias potential. Lastly, all other traces of the second plurality of conductive traces are biased at the first bias potential.

43 Claims, 11 Drawing Sheets

VOLTAGE BIASING FOR MAGNETIC RAM WITH MAGNETIC TUNNEL MEMORY CELLS

CROSS-REFERENCE TO RELATED APPLICATIONS

The present application is related to an invention entitled "Voltage Biasing For Magnetic Ram With Magnetic Tunnel Memory Cells", by Roy E. Scheuerlein, Ser. No. 08/982,893, concurrently with the present invention, commonly assigned, and incorporated by reference herein.

The U.S. Government has a paid-up license in this invention and the right in limited circumstances to require the patent owner to license others on reasonable terms as provided by for the terms of contract No. MDA 972-95-3-0004 awarded by the Advanced Research Projects Agency.

BACKGROUND OF THE INVENTION

1. Field of the Invention

The present invention relates to the field of data storage. More particularly, the present invention relates to a magneto-resistive memory cell for a cross point memory array and a technique for biasing the magneto-resistive memory cell.

2. Description of the Related Art

FIG. 1 depicts a magneto-resistive (MR) element memory array that is organized as a cross point array. Individual memory cells are formed at the crossing points of bits lines (BL) and word lines (WL). An array of magnetic memory cells is often called a magnetic random access memory (MRAM). For cross point arrays using MR memory cells based on an anisotropic magnetoresistive (AMR) effect for storing information, cell resistive values are on the order of 10 to 100 Ohms. For the cross point array of FIG. 1, the MR cells use magnetic tunnel junctions (MTJ) that can have a resistive cell value that is on the order of 1000 to 100,000 Ohms, and having a magnetoresistive effect of 10% to 30%. Consequently, a cross point array using MTJ memory cells has a significantly lower power dissipation level than that of an array using AMR memory cells.

Nevertheless, cross point arrays having memory cells using only MR elements are not practical unless each cell includes a selection device because there are many sneak paths from a selected bit line through unselected word lines, then through unselected bit lines, and finally to the selected word line. To make a cross point array practical, a selection device, such as a diode having a current-voltage characteristic like that shown in FIG. 2, can be included in each memory cell for preventing sneak path conduction. Use of such a selection device also further reduces power dissipation of the array because the current used for sensing a cell flows only through a single magnetic tunnel junction.

FIG. 1 shows a cross point array 10 having memory cells 11 formed from a magnetic tunnel junction device MTJ and a diode D. Such a cross point array is described in U.S. Pat. No. 5,640,343 to W. G. Gallagher et al. and incorporated by reference herein. The biasing range for the diode selection device used in the Gallagher et al. memory cell is from about 1 V forward voltage to about 1 V reverse voltage. During a write operation, or between read and write operations, all word lines are held at their unselected bias levels Vw, which is about 1 V greater than the bias level Vb of the unselected bit lines. Thus, all selection device diodes remain reversed-biased during a write operation, or between read and write operations, as represented by point U in FIG. 2.

For cross point array 10 of FIG. 1, a cell S is read or sensed by a bit line BL1 being selected and brought to bias level Vw, and a word line WL1 being selected and brought to bias level Vb, so that only the diode of selected cell S is forward-biased. To write a zero or a one to a cell, bit line currents in opposite directions are used and, in order to generate these currents, a ground potential is avoided for the unselected bit line voltage Vb, which is typically about 1 V. Therefore, the arrays have unselected word lines that are at a voltage Vw, that is, at about 2 V. The sensing circuitry connected to the selected bit line has, as expected in known circuit design practice, a third bias level that is significantly higher than 2 V. The power supply for the circuitry controlling such an array must be capable of supplying three bias potentials, with one of the bias potentials being greater than is desirable for deep sub-micron VLSI technology. Also, for the cross point array of FIG. 1, a bit line bias voltage must change by 1 V to read a selected cell, requiring substantial time to complete a read operation.

Even though the current through a conventional diode selection device goes to zero for a zero bias voltage, the resistance of the diode approaches a relatively low non-zero value in the sense that the resistances of cells connected to a selected bit line can still have an effect on the sensing of the resistance value of cell S because of slight variations in voltage on the bit line at sense time. Thus, a high zero-bias resistance is desired for the selection device.

FIG. 3 shows a current-voltage characteristic for a bidirectionally conducting nonlinear resistance element. If such a resistance element is used as a memory cell selection device in the cross point array of FIG. 1, a substantial sneak-path current would flow from unselected word lines that are biased at Vw (about 2 V) through cells to unselected bit lines that are biased at Vb (about 1 V). This undesirable condition is represented by point X in FIG. 3. Consequently, for the cross point array of FIG. 1 to have a useful number of memory cells using a bidirectionally conducting nonlinear resistance element for a selection device, the power dissipated by the sneak-path current would significantly exceed the power dissipated when sensing a selected cell S.

Additionally, portions of unselected word lines would have a potential that is below Vw because of a voltage drop caused by sneak-path currents passing through unavoidable series resistances existing in practical VLSI circuit lines. Thus, the diodes in unselected cells connected to the selected bit line indicated by an "F" in FIG. 1 would be forward biased. Sneak currents, as represented by point F' in FIG. 3, would flow through many F-type cells for each selected cell S, interfering with the sensing of cell S.

Consequently, bidirectionally conducting nonlinear resistance selection devices having a symmetrical current-voltage characteristic, like the current-voltage characteristic shown in FIG. 3, or devices having a lower turn-on voltage for conduction in the reverse bias direction than in the forward bias direction, like the current-voltage characteristic for a backward diode shown in FIG. 4, would naturally be avoided for magneto-resistive memory arrays.

What is needed is a nonvolatile cross point memory array having memory cells that are capable of operating at voltages and power levels that are suitable for integration using deep sub-micron VLSI technologies. What is also needed is a memory cell having a cell selection device providing a low series resistance and a low voltage biasing, thereby providing a low power cross point memory array than conventional cross point memory arrays. Further, what is needed is an MR memory cell having operating biasing points providing a reduced voltage swing required for selecting a bit line so that sensing times are thereby shorter than conventional MR memory cells. Further still, what is needed is a cross point memory array that uses a bias level that minimizes power dissipation in the array.

SUMMARY OF THE INVENTION

The present invention provides a nonvolatile cross point memory array having memory cells that are capable of operating at voltages and power levels that are suitable for integration using deep sub-micron VLSI technologies. The present invention also provides a memory cell having a bidirectionally conducting nonlinear resistance cell selection device providing a low series resistance and a low voltage biasing, and thereby providing a low power cross point memory array than conventional cross point memory arrays. The MR memory cell of the present invention has operating biasing points that provide a reduced voltage swing required for selecting a bit line so that sensing times are thereby shorter than conventional MR memory cells.

The advantages of the present invention are provided by a nonvolatile memory array that includes a substrate, a first plurality of electrically conductive traces formed on the substrate, a second plurality of electrically conductive traces formed on the substrate and overlapping the first plurality of traces at a plurality of intersection regions, and a plurality of memory cells formed on the substrate, with each memory cell being located at an intersection region between one of the first plurality of traces and one of the second plurality of traces. Each memory cell includes a bidirectionally conducting nonlinear resistance selection device, and a magneto-resistive element, such as a magnetic tunnel junction device, electrically coupled in series with the selection device.

According to the invention, each selection device has a low series resistance at a forward bias voltage, and a high resistance near zero bias. Preferably, the selection device is a unipolar barrier device, such as a Camel diode, a planar doped barrier device or a backward diode.

The present invention provides a biasing method for a read operation which biases a selected trace of a first plurality of electrically conductive traces at a first bias potential. All other traces of the first plurality of conductive traces are biased at a second bias potential. A selected trace of a second plurality of conductive traces is biased at a third potential. All other traces of the second plurality of conductive traces are biased at the first potential. For this biasing method, the second bias potential is between the first bias potential and the third bias potential, with a difference in potential between the second bias potential and the first bias potential preferably being between about 200 mV and 500 mV. According to the invention, the step of biasing the selected trace of the second plurality of conductive traces at the third potential can occur either before or after the step of biasing the selected trace of the first plurality of electrically conductive traces at the first bias potential.

The present invention also provides a method for biasing a nonvolatile memory array during a write operation in which a first plurality of electrically conductive traces are biased at a first bias potential. A selected trace of a second plurality of conductive traces is biased at a second bias potential, with the second bias potential being about equal to the first bias potential. All other traces of the second plurality of conductive traces are biased at a third bias potential. Lastly, a write operation is performed on at least one memory cell coupled to the selected trace of the second plurality of traces. According to the invention, the difference in potential between the first bias potential and the third bias potential is between about 200 mV and 500 mV.

The present invention provides an alternative method of biasing a nonvolatile memory array during a write operation in which a first plurality of electrically conductive traces are biased at a first bias potential. A second plurality of conductive traces are biased at a second bias potential, with a different in potential between the first bias potential and the second bias potential is between about 200 mV and 500 mV. Then, a write operation is performed on at least one memory cell coupled to a selected trace of the second plurality of traces.

The present invention also provides a method of biasing a nonvolatile memory array during a standby time between consecutive read operations, between a write and a read operation, or between consecutive write operations of the memory array in which a first plurality of electrically conductive traces are biased at a first bias potential. A second plurality of conductive traces are biased at a second bias potential, with a difference in potential between the first bias potential and the second bias potential being between about 200 mV and 500 mV.

The present invention provides an alternative method of biasing a nonvolatile memory array during a standby time between consecutive read operations, between a write and a read operation, or between consecutive write operations of the memory array in which a first plurality of electrically conductive traces are biased at a first bias potential. A selected trace of a second plurality of electrically conductive traces is biased at a second bias potential, which is preferably a circuit ground. Lastly, all other traces of the second plurality of conductive traces are biased at a third bias potential. According to the invention, a difference in potential between the third bias potential and the second bias potential is about 1 V, and a difference in potential between the third bias potential and the first bias potential is between about 200 mV and 500 mV.

The present invention also provides an alternative method for biasing the nonvolatile memory array during a read operation by biasing a first plurality of electrically conductive traces at a first bias potential. Each trace of the first plurality of traces is aligned in a first direction on a substrate. A selected trace of a second plurality of conductive traces is biased at a second potential. Each trace of the second plurality of traces is aligned in a second direction of the substrate, with the second direction being different from the first direction. All other traces of the second plurality of conductive traces are biased at the first potential. Preferably, the different in potential between the first bias potential and the second bias potential is about 1 V, and the second potential is a circuit ground potential.

BRIEF DESCRIPTION OF THE DRAWING

The present invention is illustrated by way of example and not limitation in the accompanying figures in which like reference numerals indicate similar elements and in which.

DETAILED DESCRIPTION

The present invention provides a memory cell for a cross point magneto-resistive memory that uses a bidirectionally conducting nonlinear resistance selection device in series with a magnetic tunnel junction MTJ. According to the invention, the selection device has a high resistance for a low bias voltage and a resistance that is several orders of magnitude lower for a bias voltage of about 1 V. Such a selection device has a current-voltage characteristic like that of a unipolar barrier device, shown in FIG. 3, or like that of a backward diode, shown in FIG. 4. Other suitable selection devices include such devices as a planar doped barrier device and a Camel diode. These types of devices differ drastically in the large reverse bias region, but the bias techniques of the present invention avoids the large reverse bias region.

The MTJ element, the selection device and the memory cell contacts are arranged vertically in an intersection region between a bit line and a word line, thus minimizing the total memory surface area. Consequently, the present invention provides magneto-resistive memory arrays having more cells connected to a bit line and having a higher performance than conventional magneto-resistive memory arrays.

The MTJ element has a series resistance that is greater than 500 Ohms, and is achieved for small area MTJ elements by increasing the thickness, or electrical barrier height, of the tunneling barrier layer. The series resistance of the selection device when the selection device is biased above its turn-on voltage is minimized by using highly-doped semiconductor regions so that the resistance of the MTJ can be accurately sensed because the MTJ resistance dominates the total series resistance through a memory cell during a read operation. When the selection device is not selected because a bias voltage that is essentially zero is applied, the resistance value of the selection device is orders of magnitude greater than the resistance value of the MTJ element. Consequently, adverse effects occurring when the resistance of a selected cell S is sensed caused by memory cells being connected to a selected bit line are minimized. The power dissipated when sensing the state of a memory cell is reduced by the increased resistance of the MTJ, and by directing the sensing current through a single memory cell.

Figure 5:
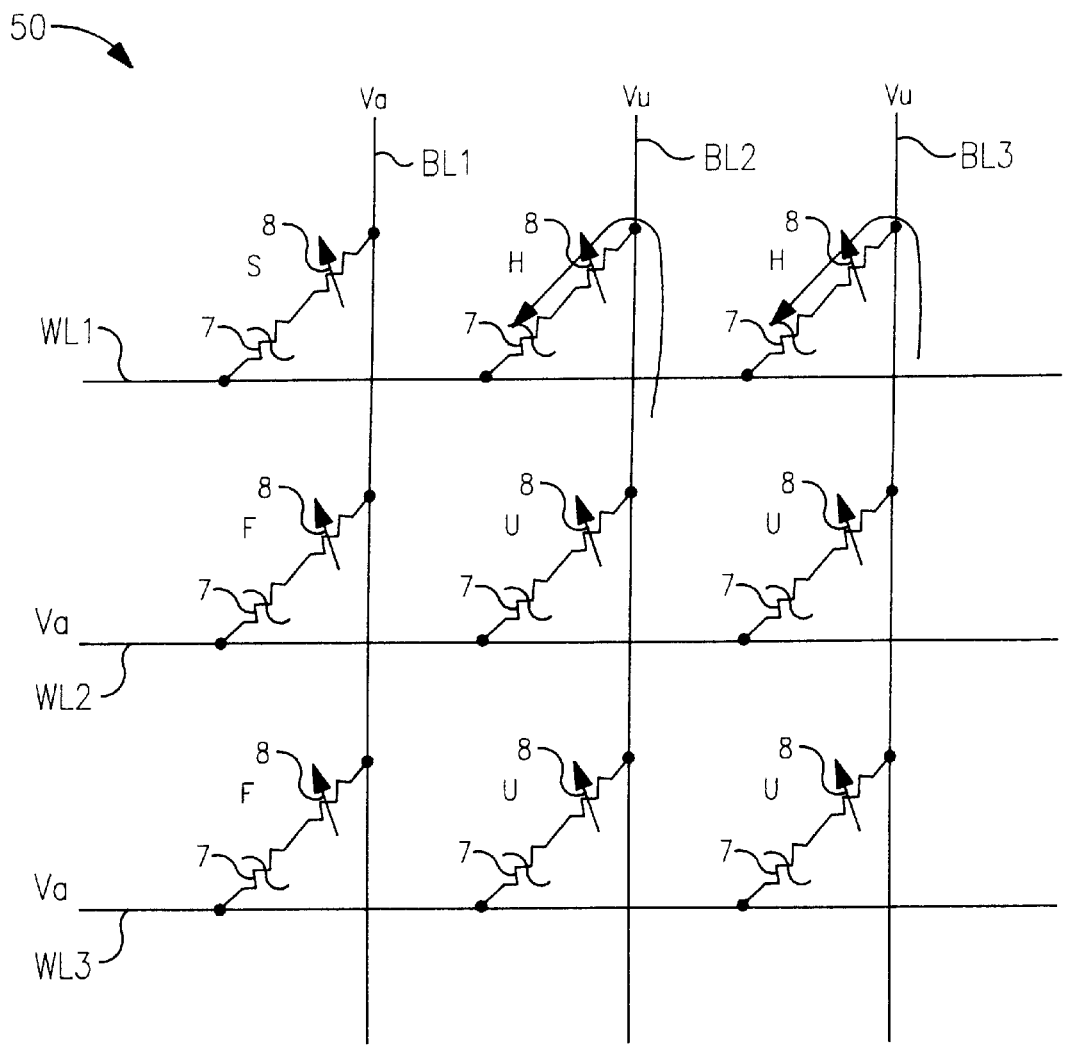
FIG. 5 depicts a cross point array having memory cells each using a bidirectionally conducting nonlinear resistance selection device according to the present invention.
Figure 6A:
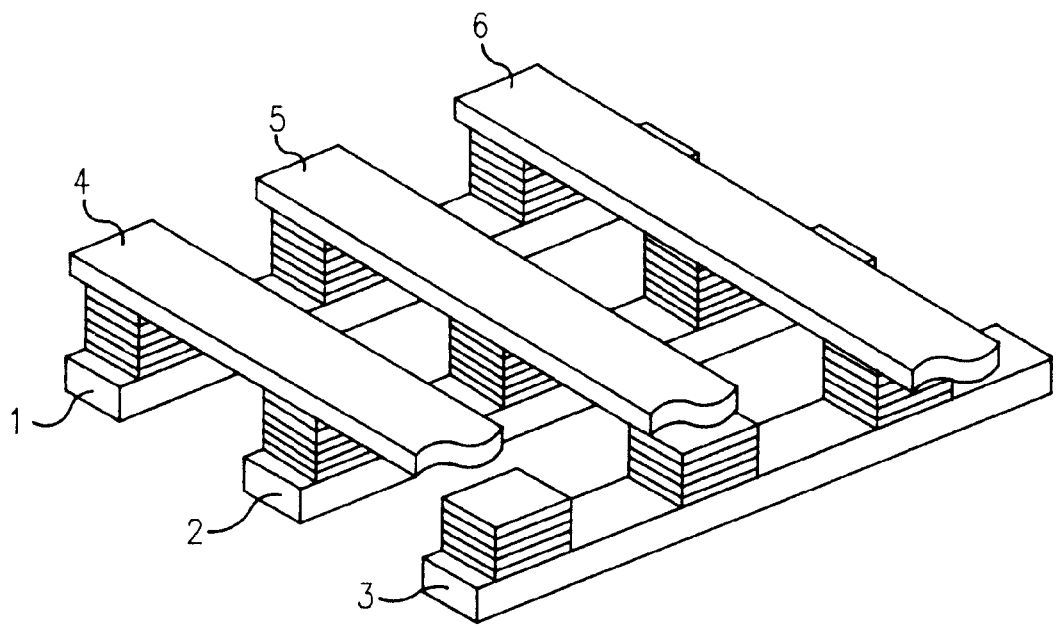
FIG. 6A shows a cross point array having a plurality of magnetic memory cells that are each located in a vertical space between bit and word lines.

FIG. 5 depicts a cross point array 50 having memory cells each using a bidirectionally conducting nonlinear resistance selection device. FIG. 6A shows an exemplary embodiment of cross point array of magneto-resistive memory cells of the present invention. The array includes a set of electrically conductive traces that function as parallel word lines 1, 2, and 3 in a horizontal plane, and a set of electrically conductive traces that function as parallel bit lines 4, 5, and 6 in another horizontal plane. The bit lines are oriented in a different direction, preferably at right angles to the word lines, so that the two sets of lines appear to intersect when viewed from a direction normal to their respective planes. A memory cell is located between each crossing point of the word lines and bit lines within the intersection region that is disposed vertically between the word and bit lines. While only three word lines and three bit lines are shown in FIG. 6A, the total number of lines used for a cross point array of magneto-resistive memory cell according to the present invention is typically much greater.

Figure 6B:
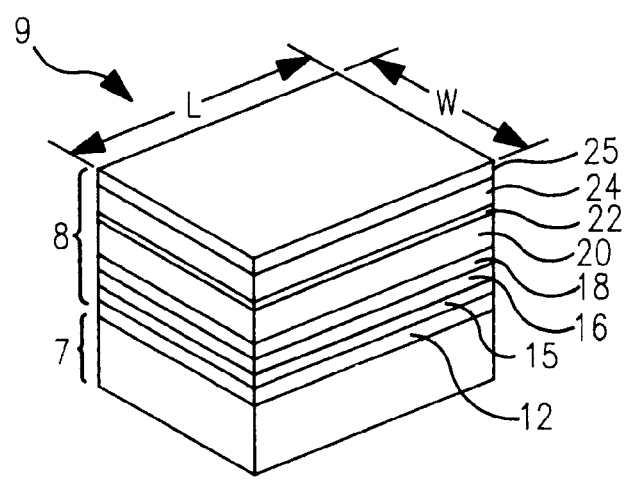
FIG. 6B is an enlarged view of a memory cell shown in FIG. 6A for a cross point memory array according to the present invention.

FIG. 6B shows an enlarged view of the structure of an exemplary memory cell 9. Memory cell 9 is formed on and in contact with a word line 3 (FIG. 6A), and includes a vertical stack of a selection device 7 and an MTJ 8 in an electrical series connection. Selection device 7 is a bidirectionally conducting nonlinear resistance device, such as a Camel diode, a planar doped barrier device, or a backward diode. During operation of the array, current flows in a vertical direction through memory cell 9. The electrical contacts between a word line, the MTJ and the selection device of a cell, and to a bit line all occupy the same vertical area. While not shown in FIG. 6A, the array is formed on a substrate, such as a silicon substrate, on which other circuitry can be formed. Also, a layer of insulative material that is not shown is located between the bit lines and word lines at regions of the array other than the intersecting regions.

Figure 6C:
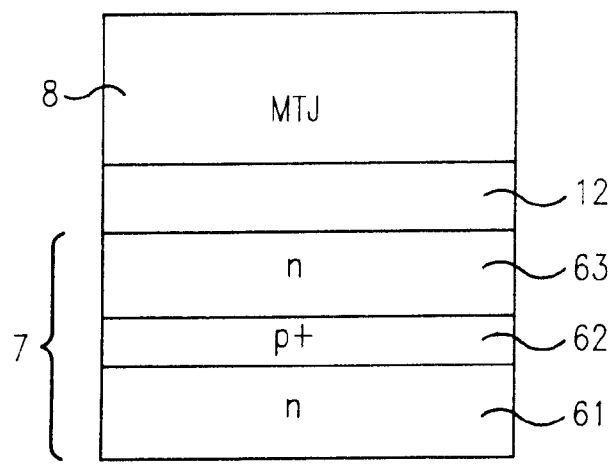
FIG. 6C shows details of the structure of a Camel diode that is suitable for a cell selection device according to the present invention.
Figure 6D:
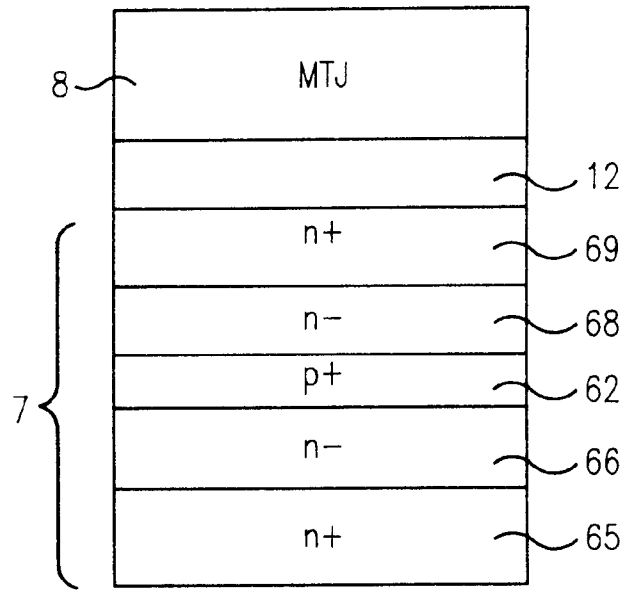
FIG. 6D shows details of the structure of a planar doped barrier device that is suitable for a cell selection device according to the present invention.

FIGS. 6C and 6D shows details of structures of unipolar barrier devices that are suitable for use as selection device 7. FIG. 6C shows the structure of a "Camel diode", while FIG. 6D shows the structure of a planar doped barrier device. The term "Camel diode" is somewhat of a misnomer because Camel diodes can have symmetrical current-voltage characteristics, like the current-voltage characteristic shown in FIG. 3. Both of these unipolar barrier devices are formed in a semiconductor material such as silicon, but gallium arsenide, germanium and other common semiconductors can also be used. The Camel diode structure shown in FIG. 6C has a series of semiconductor regions along the current path that includes a first n-type layer 61, a heavily doped p-type layer 62, and a second n-type layer 63. Layer 63 is connected to MTJ 8 via a tungsten stud 12. P-type layer 62 is fabricated to be thin and, consequently, is depleted by the built-in voltage associated with the n-type and p-type junctions. The total dopant of p-type layer 62 can be adjusted in a well-known manner for varying the effective barrier height of the device. Since a narrow and highly doped p-type layer is desired, molecular beam epitaxy methods are preferably used for forming suitable Camel diode devices. Suitable Camel diode devices can also be fabricated in a complementary form by changing all n-type regions to p-type regions and vice versa.

Figure 1:
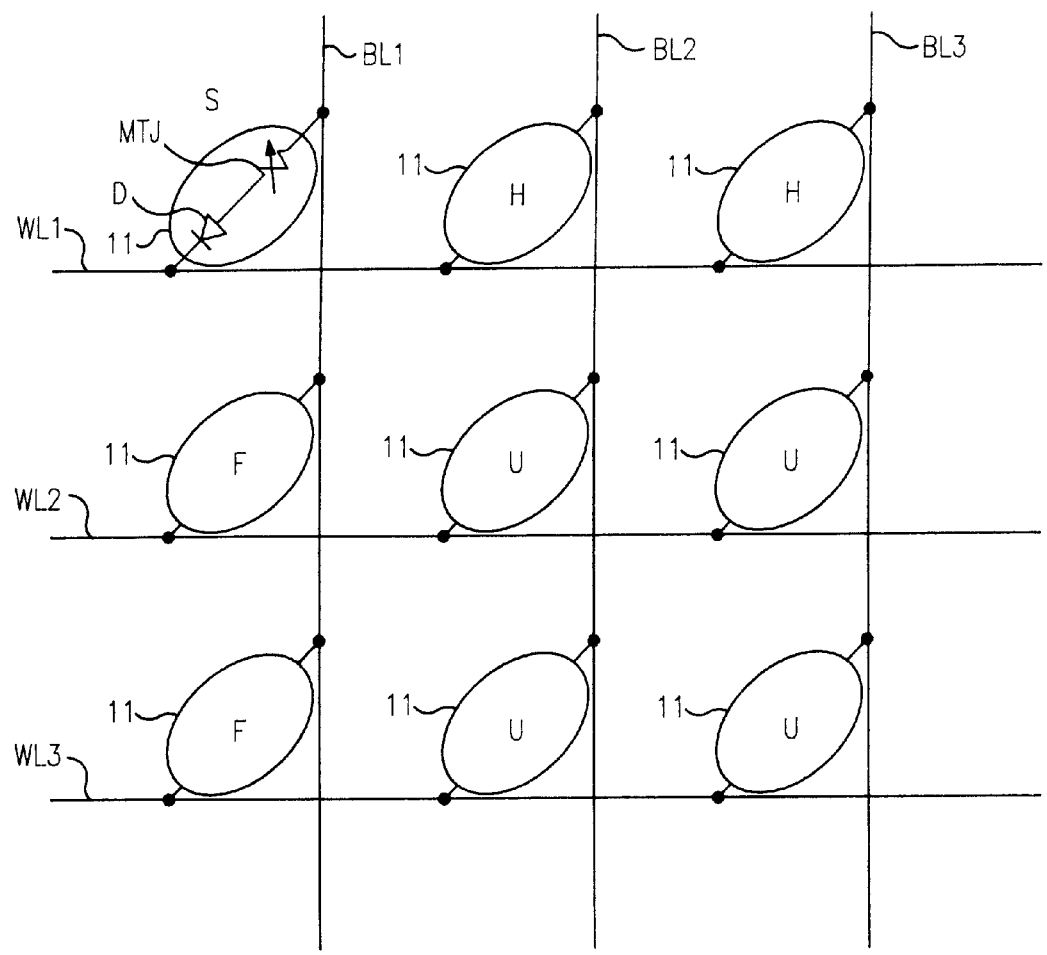
FIG. 1 depicts a magneto-resistive element memory array that is organized as a cross point array.
Figure 2:
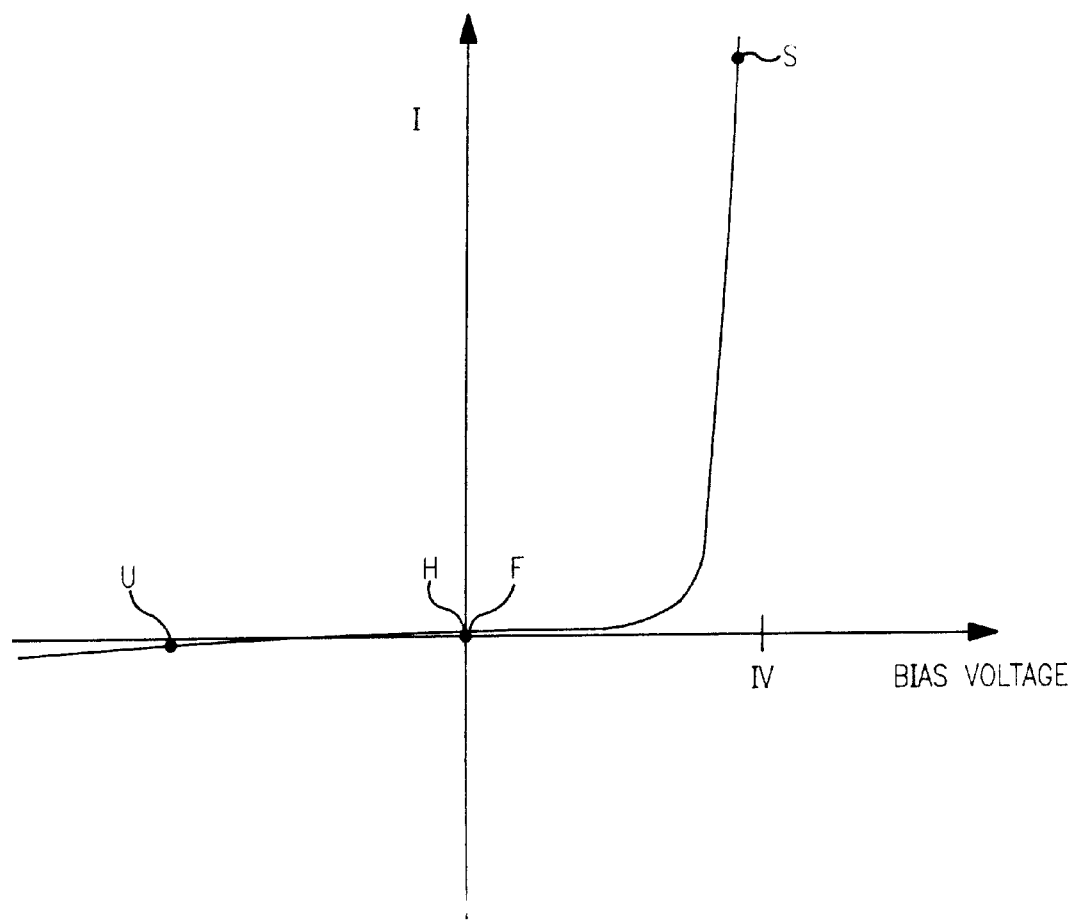
FIG. 2 shows a voltage-current characteristic diagram for a p-n diode.
Figure 3:
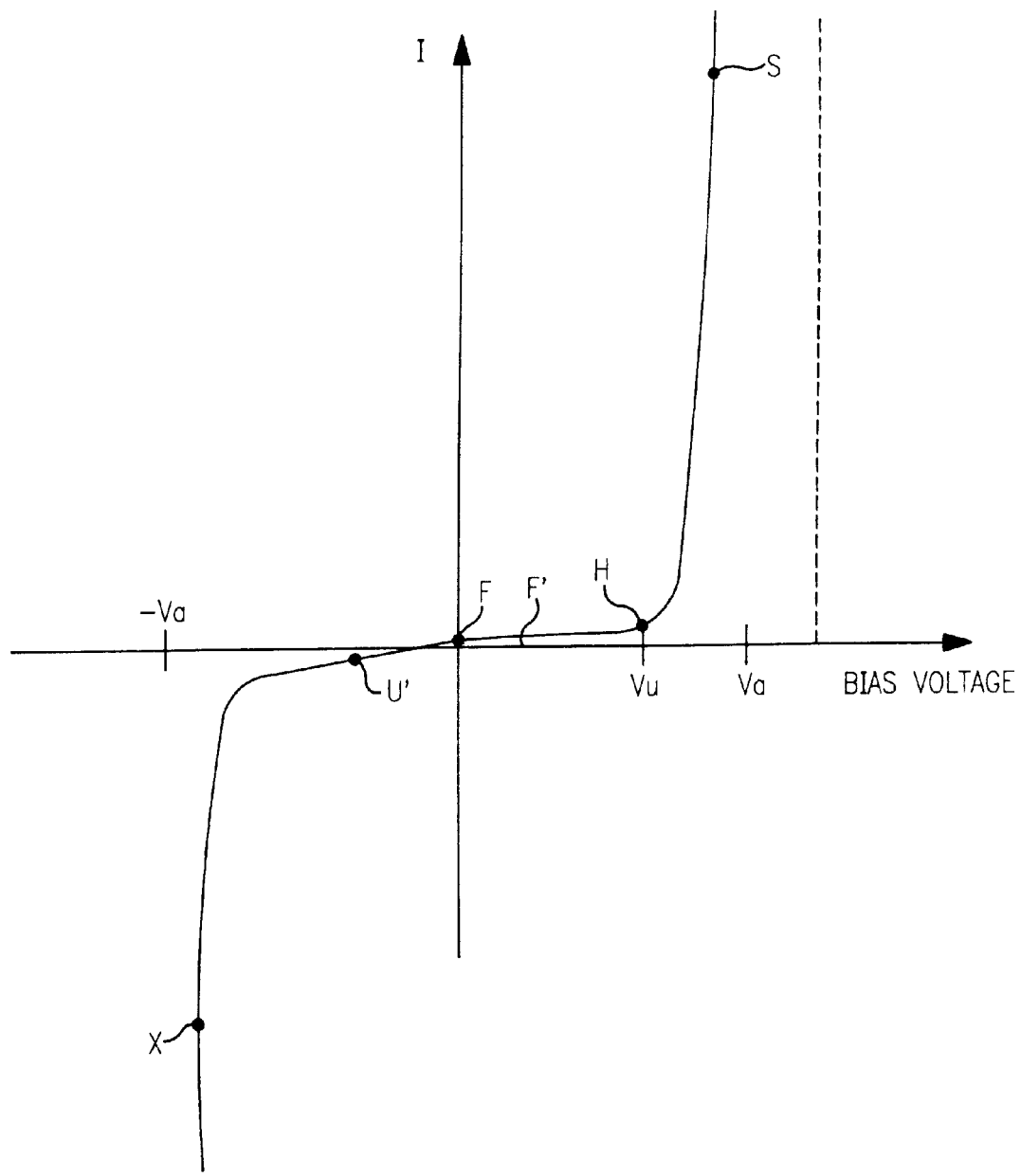
FIG. 3 shows a voltage-current characteristic diagram for a bi-directionally conducting non-linear resistance element.

Conduction through a Camel diode device is primarily caused by thermionic emission of majority carriers over the barrier when a bias is applied. Thermionic emission produces exponential changes in the resistance, as shown in FIG. 3. Majority carrier devices have speed advantages because there are no minority carrier storage effects. Majority carrier devices also can have thin n-type layers for reduced series parasitic resistance, thus minimizing the effect of selection device 7 when sensing MTJ 8 in series with selection device 7.

The planar doped barrier device shown in FIG. 6D has a series of semiconductor regions along the current path that includes a first n-type layer 65, a second n-type layer 66, a heavily doped p-type layer 67, a third n-type layer 68 and a fourth n-type layer 69. A planar doped barrier device differs from a Camel diode in that a low-doped n-type region is included between the n-type and p-type regions. That is, low-doped n-type layer 66 is formed between n-type layer 65 and p-type layer 62. Similarly, low-doped n-type layer 68 is formed between p-type layer 62 and n-type layer 69. The two low-doped n-type regions are also depleted by the builtin voltage associated with n-type and p-type junctions, while reducing the capacitance and peak field within the device. Layer 69 is connected to MTJ 8 via a tungsten stud 12. The barrier height of a planar doped barrier is higher than that of a Camel diode because the low-doped n-type layers reduce the barrier lowering caused by the Schottky effect. The higher barrier produces a selection device having a higher zero bias resistance that is desired for large cross point magnetoresistive memory arrays. Consequently, unipolar barrier devices are preferably used as switching devices for cross point magnetoresistive arrays with the bias method of the present invention because such devices have a low series resistance, a low capacitance, no minority carrier storage effects for high speed selection of a cross point magnetoresistive memory cell, and a high zero bias resistance making possible larger numbers of devices connected to a bit line.

Figure 7:
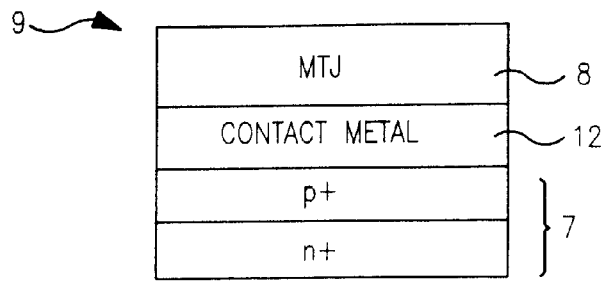
FIG. 7 shows details of the structure of a memory cell having a backward diode and an MTJ element according to the present invention.

The structure of another suitable memory cell 9 having a backward diode and a MTJ element is shown in FIG. 7. A backward diode is a p+ to n+ junction device having doping concentrations in the range of $1 \times 10^{19}$ to $1 \times 10^{20}$ atoms per $cm^2$ in the p+ and n+ regions so that the fermi level of the semiconductor regions are nearly, but not quite, in the valence and conduction bands, respectively. When a positive bias is applied to the p+ region of a backward diode having a fermi level of about 100 mV from the band edges, the p+ region energy level falls and conduction occurs by thermionic emission for turn-on voltages of about 0.9 V, which is several hundred millivolts greater than turn-on voltages for conventional pn junction diodes. Under reverse-bias conditions, the current-voltage characteristic of a backward diode is strikingly different than that of a pn junction diode. When 200 mV of positive bias is applied to the n-type region of a backward diode, electrons can tunnel across the junction from the n+ region conduction band to the p region valence band producing large tunneling currents. The series resistance for both conduction paths is low due to the high doping levels. The zero bias resistance is high due to the large turn-on voltage for thermionic conduction. Both of these characteristics are advantageous for the selection device in series with an MTJ for a magneto-resistive cell.

Returning to FIG. 6B, MTJ 8 is formed by a series of layers of material stacked one on top of the other. Preferably, MTJ 8 includes a template layer 15, such as Pt, an initial ferromagnetic layer 16, such as permalloy (Ni-Fe), an antiferromagnetic layer (AF) 18, such as Mn-Fe, a fixed ferromagnetic layer (FMF) 20, such as Co-Fe or permalloy, a thin tunneling barrier layer 22 of alumina ($Al_2O_3$), a soft ferromagnetic layer (FMS) 24, such as a sandwich of thin Co-Fe with permalloy, and a contact layer 25, such as Pt.

The bias techniques of the present invention are described with reference to FIGS. 3–5 and 8A–8C. FIG. 5 shows a selected cell (indicated by an S), the other cells (indicated by an F) connected to the selected bit line, the half selected cells (indicated by an H), and the unselected cells (indicated by a U). Only bit line BL1 and word line WL1, which cross at selected cell S, are used for reading and writing information to cell S. No other control lines from outside the array are necessary to read or write the memory state of the memory cells, providing an efficient memory array. Additionally, a p-n semiconductor diode can be used as the nonlinear resistance selection element with the bias techniques of the present invention.

Figure 8A:
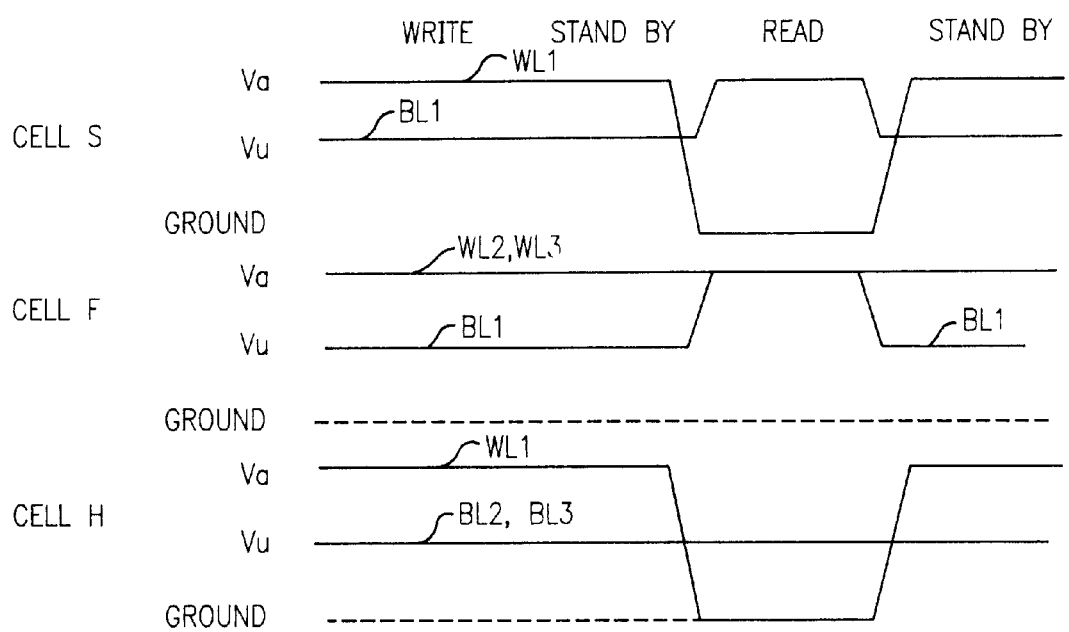
FIG. 8A shows biasing levels for a first biasing technique according to the present invention.
Figure 8B:
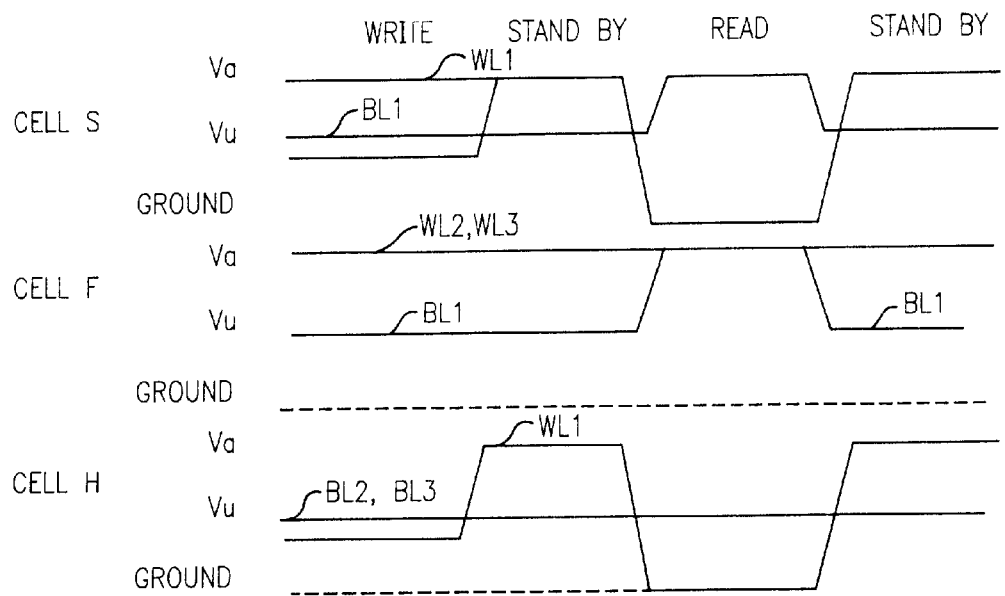
FIG. 8B shows biasing levels for a second biasing technique according to the present invention.
Figure 8C:
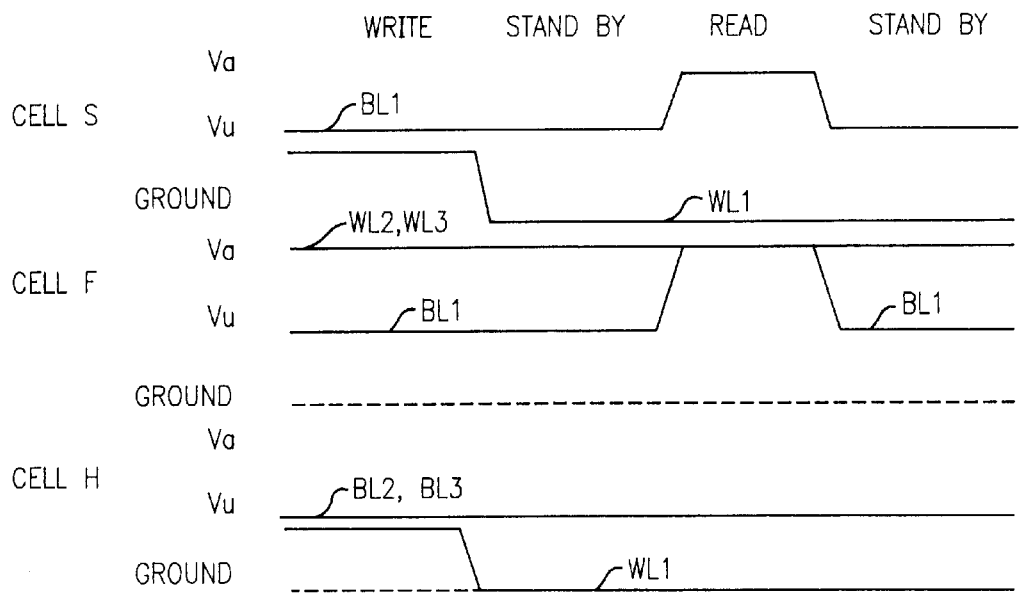
FIG. 8C shows biasing levels for a third biasing technique according to the present invention.

A memory cell is written by a combination of bit line and word line currents that rotate the magnetization of FMS layer 24 in the MTJ 8, as is described in detail in the Gallagher et al. patent, except that for the present invention, the voltage levels of the bit lines and word lines that are not selected are biased so that all the cells are reversed biased by about 1 V. As shown in FIGS. 8A–8C, and described below in five alternative bias techniques, the word lines are biased at a potential of Va and the bit lines are biased at a potential that is at an intermediate voltage Vu, or at the same voltage as the word lines. Preferably, the sensing scheme for the memory cell, which is described in detail in the Gallagher et al. patent, has a voltage across the selected MTJ element that is deliberately clamped at Va so that the bias potential appearing across unselected cells along the selected bit line is substantially zero.

A first biasing technique of the present invention is illustrated by FIG. 8A. The bit line bias voltage is selected so that a large reverse bias voltage on the selection device is avoided. A cell S is selected for a read operation by reducing the voltage applied to the appropriate word line (WL1) to be about 1 V below the voltage of the unselected word lines (WL2, WL3) and the appropriate bit line (BL1) is selected by raising the voltage applied to the selected bit line to be above the unselected voltage bias for the unselected bit lines (BL2, BL3). The unselected bit lines have an intermediate bias voltage that is between the bias voltage of the selected bit line and the bias voltage of the selected word line. The intermediate bias voltage is selected to provide a small reverse bias of 100 to 500 mV for U-type memory cells, indicated by point U in FIGS. 3 and 4.

During a write operation (WRITE), or between read and write operations (STANDBY), FIG. 8A shows that word lines WL1, WL2 and WL3 are biased to potential Va and bit lines BL1, BL2 and BL3 are biased to an intermediate potential Vu. During a read operation (READ) of cell S, the potential of word line WL1 is reduced to circuit ground and the potential of bit line BL1 is increased to Va. Unselected word lines WL2 and WL3 remain at a bias potential of Va, while the unselected bit lines BL2 and BL3 remain at intermediate potential Vu.

Figure 4:
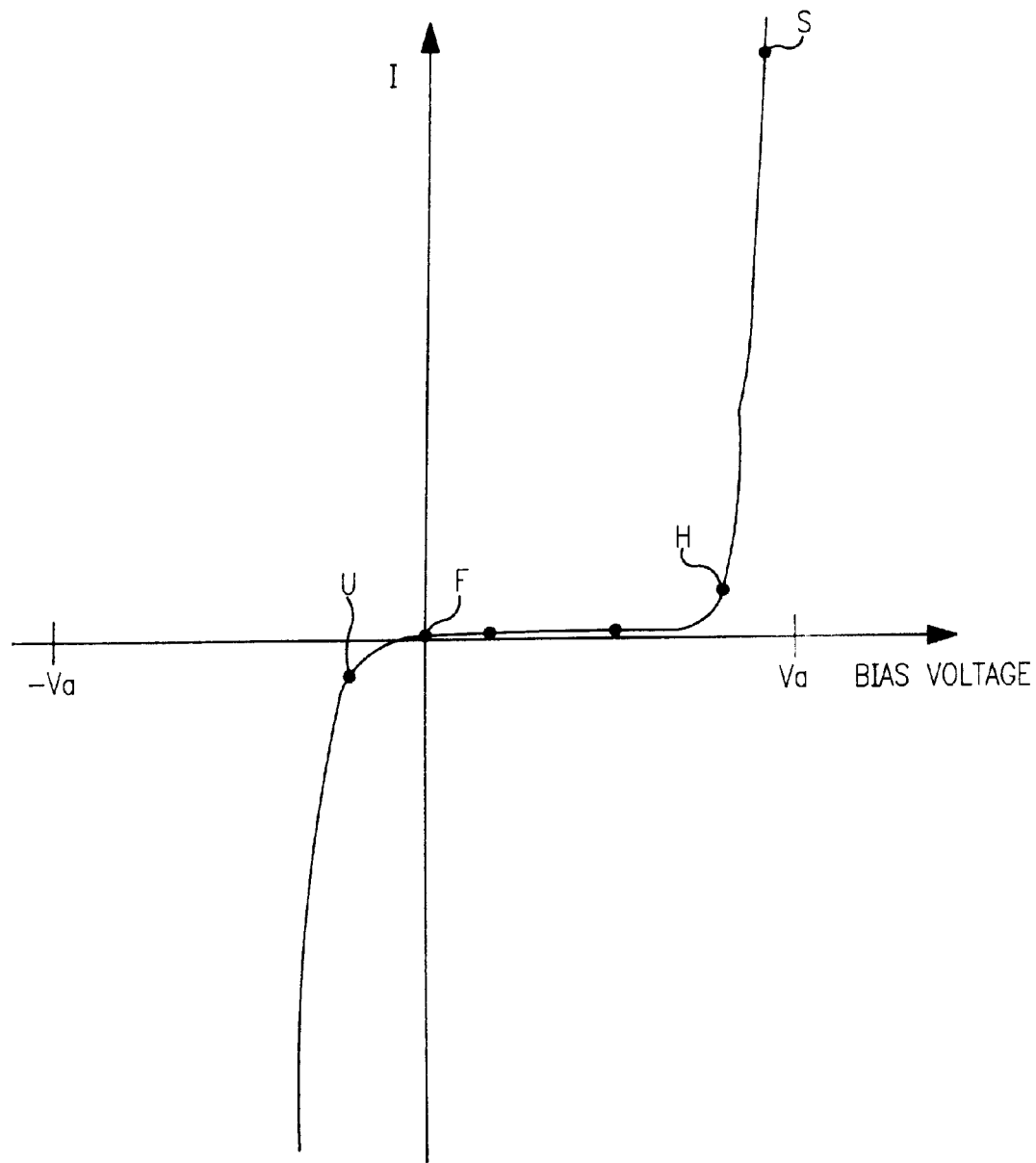
FIG. 4 shows a voltage-current characteristic diagram for a backward diode.

The current flowing through selected cell S is large, as shown by point S in FIGS. 3 and 4. The voltage swing for selected bit line BL1 is less than voltage Va and, consequently, makes a high performance cell access possible. The potential applied to selected bit line BL1 and unselected word lines WL2 and WL3 are fixed at the same potential so currents flowing through H-type cells, as represented by point H in FIGS. 3 and 4, do not interfere with the reading of selected cell S. Data dependent voltage on selected bit line BL1 would make it more difficult to apply the same potential to unselected word lines WL2, WL3 and to selected bit line BL1. Therefore, it is preferred to apply a potential of Va to the selected bit line while reading the selected cell and detect the change in current through selected cell S based on the resistance state of the magnetoresistive element. This minimizes the interference of F-type cells during read operations, and is especially important as the size of the array increases such that the number of F-type cells increases.

The bias potential applied to the unselected bit lines is at a level that equalizes two leakage currents. That is, the current through all of the half-selected cells, i.e., all of the cells connected to the selected word line except for the selected cell, and the current through the large number of cells that are connected to both the unselected bit lines and the unselected word lines. Half-selected cells are indicated by an "H" in FIGS. 5 and 8A–8C. The unselected cells ("F" cells in FIG. 5) along the selected bit line have substantially zero bias voltage across their selection device.

The voltage drop across H-type cells is substantially less than the voltage drop across selected cell S. Thus, the current flowing through selected cell S, shown as point S in FIGS. 3 and 4, is orders of magnitude greater than the current through an H-type cell, shown as point H in FIGS. 3 and 4, based on the nonlinear current-voltage characteristics of selection device 7. Arrays of cells having 100 to 1000 H-type cells along the word lines have an extra current into the bit line that is no more than about several times the sense current through cell S. This is acceptable because the word line has a current carrying capability that is many times greater than the sense current.

The current through an H-type cell, indicated by point H in FIGS. 3 and 4, equals the current through U-type cells along the same unselected bit line. Thus, during a read operation, a small current flows from unselected word lines WL2 and WL3 through unselected bit lines BL2 and BL3 and then to the selected word line WL1, as indicated by arrows drawn in FIG. 5. This current is less than the current that would be dissipated by bias supply circuits if the unselected bit lines were held to any other bias voltage and, therefore, is the optimum for power dissipation. Additionally, the bit lines naturally go to this bias level and do not require a special biasing circuit to be clamped at Vu during a read operation.

During a write operation, the word line and bit line for a selected cell S are at the unselected bias levels Va and Vu, respectively, so that the selection devices of all of the memory cells are conducting only small currents, as represented by point U in FIGS. 3 and 4. Consequently, the write currents in the bit line and word line of selected cell S are unaffected by the other cells.

FIG. 8B shows biasing levels for a second biasing technique for a standby time between consecutive read operations according to the present invention. During a read operation, the voltages applied to the bits lines and the word lines are the same as used for the first biasing technique. An intermediate voltage approximately equal to Vu can be applied to the word line for a selected cell during a write operation for conveniently generating the word line write current. Conduction through H-type cells is negligible in comparison to the write currents appearing in the word line.

FIG. 8C shows biasing levels for a third biasing technique for a standby time between consecutive read operations according to the present invention. During a read operation, the voltages applied to the bits lines and the word lines are the same as used for the first biasing technique. The bias level of an unselected bit line is controlled by selecting a word line between read and write operations. Whenever a word line is at the selected cell bias level, preferably circuit ground, and the remaining word lines are biased to the unselected bias level Va, conduction through U-type cells and H-type cells produces a bias voltage Vu on the unselected bit lines. Therefore, the need for a bias control circuit on the bit lines is avoided. A word line must be selected for selected periods of time between read and write operations for maintaining the unselected bit line bias.

In a fourth biasing technique, the last selected word line remains at the selected cell bias level until a new word line is selected. In this way, a second sequential request to the array for a cell on the same word line is faster and avoids extra switching transients, thus saving power.

Figure 9:
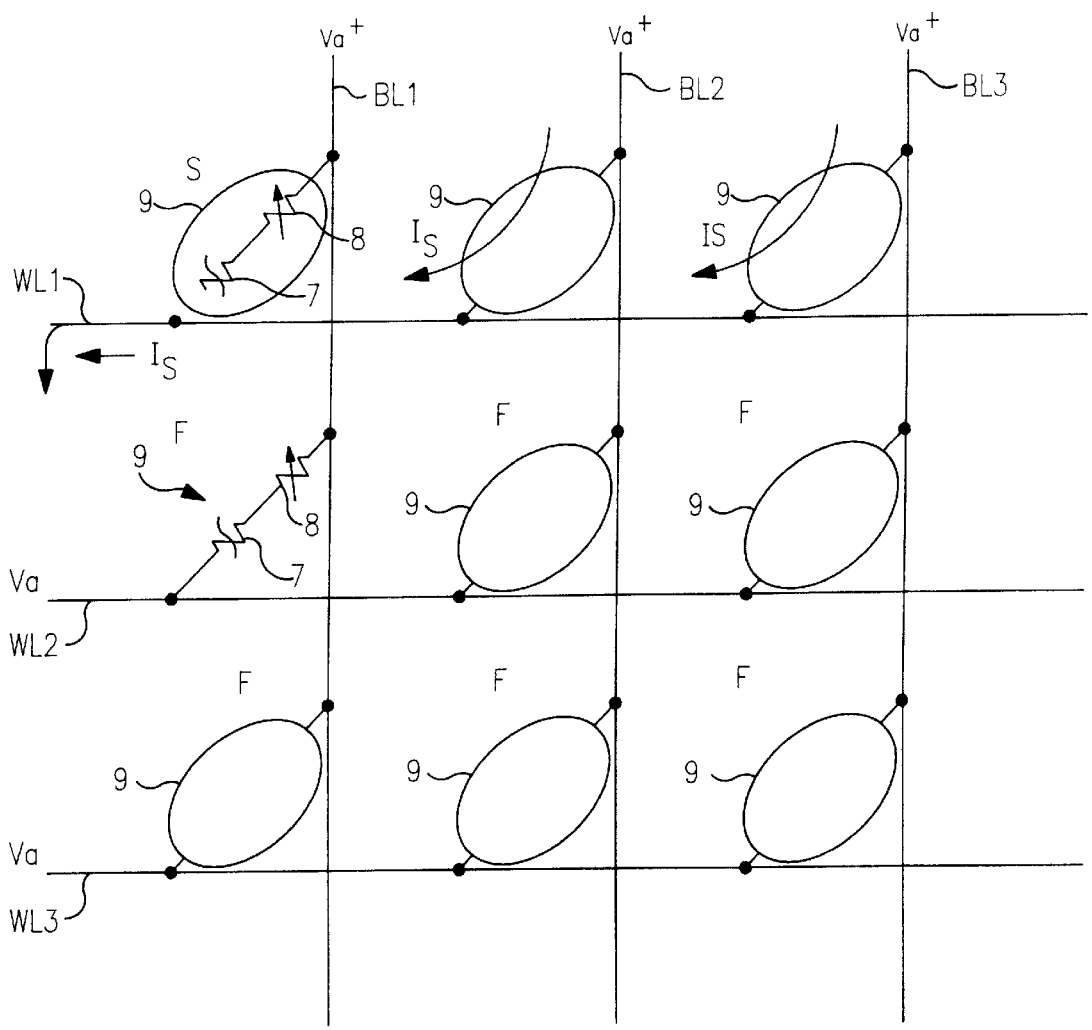
FIG. 9 depicts a cross point array for describing a fifth biasing technique according to the present invention.

In a fifth biasing technique of the present invention, the voltage swing required for selecting a bit line is eliminated so that sensing times decrease. In this biasing technique, which is described in connection with the cross point array 90 shown in FIG. 9, no voltage change occurs on a selected bit line during a read operation. All bit lines are biased at the unselected word line voltage. During a read operation, unselected cells, designated as "F", that are connected to bit lines BL1, BL2 and BL3 have substantially a zero bias voltage applied across their respective selection devices. A word line WL1 is selected by reducing its bias voltage to be about 1 V below the bias voltage of other unselected word lines WL2 and WL3 so that all of the cells along the selected word line are selected by being biased at a voltage that is equal to the difference of the bias voltage of the selected word line and the bias voltage of the bits lines. For this biasing technique, a selected word line is preferably biased at a circuit ground potential during a read operation. The bit line bias is chosen so that a large reverse bias voltage on the selection device is avoided. During a write operation, write currents are passed through the selected bit line and selected word line. The voltage on the selected bit line and the selected word line are near the bias voltage of unselected word lines and bit line so currents through the memory cells are minimized and are much smaller than the write currents.

When the word line is formed from a semiconductor material, the number of cells that can be connected to the word line is limited based on the series resistance of the word line in the semiconductor material and corresponding current density considerations so that word line selection occurs rapidly. The bit line does not change bias during a read selection, so cell access is faster than for conventional cross point arrays.

Figure 10A:
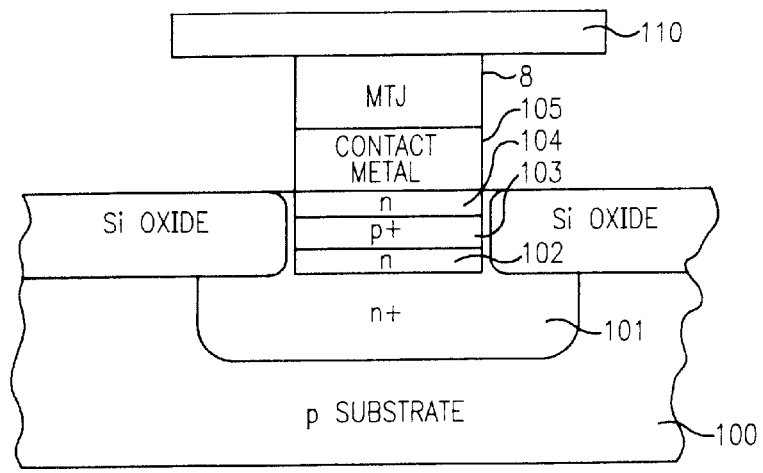
FIG. 10A shows a sectional view of a memory cell using a Camel diode and MTJ element according to the present invention.
Figure 10B:
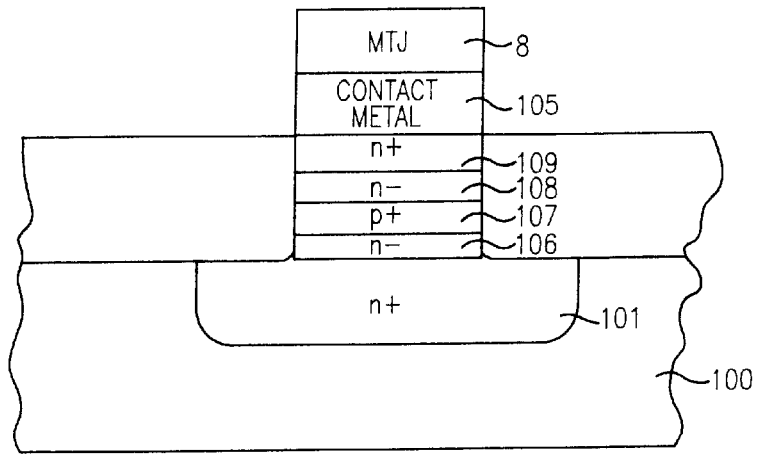
FIG. 10B shows a sectional view of a memory cell using a planar doped barrier device and an MTJ element according to the present invention.
Figure 10C:
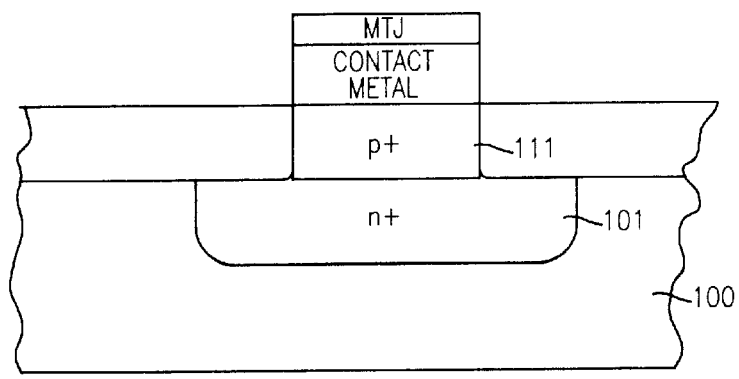
FIG. 10C shows a sectional view of a memory cell using a backward diode and an MTJ element according to the present invention.

Memory cells for three alternative embodiments of a memory cell having a bidirectionally conducting nonlinear resistor selection device formed on a semiconductor substrate 100 are shown in FIGS. 10A–10C. FIG. 10A shows a sectional view of a memory cell using a Camel diode and MTJ element according to the present invention. A local word line 101 is formed from an $n^+$-type doped region in substrate 100. An n-type region 102, a $p^+$-type region 103, an n-type region 104, a contact metal region 105, and an MTJ 8 that contacts a bit line 110 are formed in a well-known manner in succession on top of word line 101. In memory arrays having many cells along a word line, a global word line, described in detail in the Gallagher et al. patent, can be added above and insulated from bit line 110.

FIG. 10B shows a sectional view of memory cell using a planar doped barrier device and an MTJ element according to the present invention. A local word line 101 is formed from an n+-type doped region in a substrate 100. An n−-type region 106, a p+-type region 107, an n$^{31}$-type region 108, an n+-type region 109, a contact metal region 105, and an MTJ 8 that contacts a bit line (not shown) are formed in succession in a well-known manner on top of word line 101.

FIG. 10C shows a sectional view of a memory cell using a backward diode and an MTJ element according to the present invention. A local word line 101 is formed from an n+-type doped region in a substrate 100. A p+-type region 111, a contact metal region 105, and MTJ 8 that contacts a bit line (not shown) are formed in succession in a well-known manner on top of word line 101.

While the present invention has been described using an exemplary MR cross point memory array and exemplary embodiments of MR memory cells, it will be appreciated and understood that modifications may be made without departing from the true spirit and scope of the invention.

What is claimed is:

1. A method of biasing a nonvolatile memory array during a read operation, the method comprising the steps of:
    biasing a first selected trace of a first plurality of electrically conductive traces at a first bias potential, each trace of the first plurality of traces being aligned in a first direction on a substrate;
    biasing a first selected trace of a second plurality of conductive traces at a second bias potential, each trace of the second plurality of traces being aligned in a second direction of the substrate, the second direction being different from the first direction;
    biasing all other traces of the first plurality of conductive traces at a third bias potential, the third bias potential being between the first bias potential and the second bias potential;
    biasing all other traces of the second plurality of conductive traces at the first bias potential; and
    performing a read operation on a memory cell coupled to the first selected trace of the first plurality of traces and to the first selected trace of the second plurality of traces.

2. The method according to claim 1, wherein a plurality of memory cells are formed between the first and second pluralities of traces, each memory cell being located at an intersection region between one of the first plurality of traces and one of the second plurality of traces, each memory cell including a bidirectionally conducting nonlinear resistance selection device, and a magneto-resistive element electrically coupled in series with the selection device.

3. The method according to claim 1, wherein the step of performing the read operation includes the step of measuring a current flowing between the first and second plurality of traces.

4. The method according to claim 1, wherein a difference in potential between the first bias potential and the second bias potential is about 1 V.

5. The method according to claim 4, wherein the second bias potential is a circuit ground potential.

6. The method according to claim 5, wherein a difference in potential between the first bias potential and the third bias potential is between about 200 mV and 500 mV.

7. The method according to claim 6, wherein the step of biasing the first selected trace of the second plurality of conductive traces at the second bias potential occurs before the step of biasing the first selected trace of the first plurality of electrically conductive traces at the first bias potential.

8. The method according to claim 1, further comprising the step of performing a write operation, the step of performing the write operation including the steps of:
    biasing the first plurality of electrically conductive traces at the third bias potential;
    biasing a second selected trace of the second plurality of conductive traces at a fourth bias potential, the fourth bias potential being about equal to the third bias potential;
    biasing all other traces of the second plurality of conductive traces at the first bias potential; and
    performing a write operation on at least one memory cell coupled to the second selected trace of the second plurality of traces.

9. The method according to claim 8, wherein a difference in potential between the first bias potential and the third bias potential is between about 200 mV and 500 mV.

10. The method according to claim 1, further comprising the step of performing a write operation, the step of performing the write operation including the steps of:
    biasing the first plurality of electrically conductive traces at the third bias potential;
    biasing the second plurality of conductive traces at the first bias potential; and
    performing a write operation on at least one memory cell coupled to a selected trace of the second plurality of traces.

11. The method according to claim 10, wherein a difference in potential between the first bias potential and the third bias potential is between about 200 mV and 500 mV.

12. The method according to claim 11, further comprising the step of performing a standby time operation between consecutive read operations, the step of performing the standby time operation including the steps of:
    biasing the first plurality of electrically conductive traces at the third bias potential; and
    biasing the second plurality of conductive traces at the first bias potential.

13. The method according to claim 12, wherein a difference in potential between the first bias potential and the third bias potential is between about 200 mV and 500 mV.

14. The method according to claim 12, wherein the step of performing the standby time operation is performed between a write and a read operation.

15. The method according to claim 12, wherein the step of performing the standby time operation is performed between consecutive write operations.

16. The method according to claim 11, further comprising the step of performing a standby time operation between consecutive read operations, the step of performing the standby time operation includes the steps of:
    biasing the first plurality of electrically conductive traces at the third bias potential;
    biasing a second selected trace of the second plurality of electrically conductive traces at the second bias potential; and
    biasing all other traces of the second plurality of conductive traces at the first bias potential.

17. The method according to claim 16, wherein a difference in potential between the first bias potential and the third bias potential is about 1 V.

18. The method according to claim 17, wherein the second bias potential is a circuit ground potential.

19. The method according to claim 18, wherein a difference in potential between the first bias potential and the third bias potential is between about 200 mV and 500 mV.

20. The method according to claim 16, wherein the step of performing the standby time operation is performed between a write and a read operation.

21. The method according to claim 16, wherein the step of performing the standby time operation is performed between consecutive write operations.

22. A method of biasing a nonvolatile memory array during a write operation, the method comprising the steps of:

biasing a first plurality of electrically conductive traces at a first bias potential, each trace of the first plurality of traces being aligned in a first direction on a substrate;

biasing a selected trace of a second plurality of conductive traces at a second bias potential, each trace of the second plurality of traces being aligned in a second direction of the substrate, the second direction being different from the first direction, and the second bias potential being about equal to the first bias potential;

biasing all other traces of the second plurality of conductive traces at a third bias potential; and performing a write operation on at least one memory cell coupled to the selected trace of the second plurality of traces.

23. The method according to claim 22, wherein a plurality of memory cells are formed between the first and second pluralities of traces, each memory cell being located at an intersection region between one of the first plurality of traces and one of the second plurality of traces, each memory cell including a bidirectionally conducting nonlinear resistance selection device, and a magneto-resistive element electrically coupled in series with the selection device.

24. The method according to claim 23, wherein a difference in potential between the first bias potential and the third bias potential is between about 200 mV and 500 mV.

25. A method of biasing a nonvolatile memory array during a write operation, the method comprising the steps of:

biasing a first plurality of electrically conductive traces at a first bias potential, each trace of the first plurality of traces being aligned in a first direction on a substrate;

biasing a second plurality of conductive traces at a second bias potential, each trace of the second plurality of traces being aligned in a second direction of the substrate, the second direction being different from the first direction, and a difference in potential between the first bias potential and the second bias potential being between about 200 mV and 500 mV; and performing a write operation on at least one memory cell coupled to a selected trace of the second plurality of traces.

26. The method according to claim 25, wherein a plurality of memory cells are formed between the first and second pluralities of traces, each memory cell being physically located at an intersection region between one of the first plurality of traces and one of the second plurality of traces, each memory cell including a bidirectionally conducting nonlinear resistance selection device, and a magneto-resistive element electrically coupled in series with the selection device.

27. A method of biasing a nonvolatile memory array during a standby time of the memory array, the method comprising the steps of:

biasing a first plurality of electrically conductive traces at a first bias potential, each trace of the first plurality of traces being aligned in a first direction on a substrate; and biasing a second plurality of conductive traces at a second bias potential, each trace of the second plurality of traces being aligned in a second direction of the substrate, the second direction being different from the first direction, a difference in potential between the first bias potential and the second bias potential being between about 200 mV and 500 mV.

28. The method according to claim 27, wherein a plurality of memory cells are formed between the first and second pluralities of traces, each memory cell being located at an intersection region between one of the first plurality of traces and one of the second plurality of traces, each memory cell including a bidirectionally conducting nonlinear resistance selection device, and a magneto-resistive element electrically coupled in series with the selection device.

29. The method according to claim 27, wherein the steps of the method are performed between consecutive read operations.

30. The method according to claim 27, wherein the steps of the method are performed between a write and a read operation.

31. The method according to claim 27, wherein the steps of the method are performed between consecutive write operations.

32. A method of biasing a nonvolatile memory array during a standby time of the memory array, the method comprising the steps of:

biasing a first plurality of electrically conductive traces at a first bias potential, each trace of the first plurality of traces being aligned in a first direction on a substrate;

biasing a selected trace of a second plurality of electrically conductive traces at a second bias potential, each trace of the second plurality of traces being aligned in a second direction of the substrate, the second direction being different from the first direction; and biasing all other traces of the second plurality of conductive traces at a third bias potential.

33. The method according to claim 32, wherein a plurality of memory cells are formed between the first and second pluralities of traces, each memory cell being located at an intersection region between one of the first plurality of traces and one of the second plurality of traces, each memory cell including a bidirectionally conducting nonlinear resistance selection device, and a magneto-resistive element electrically coupled in series with the selection device.

34. The method according to claim 32, wherein a difference in potential between the third bias potential and the second bias potential is about 1 V.

35. The method according to claim 34, wherein the second bias potential is a circuit ground potential.

36. The method according to claim 35, wherein a difference in potential between the third bias potential and the first bias potential is between about 200 mV and 500 mV.

37. The method according to claim 32, wherein the steps of the method are performed between consecutive read operations.

38. The method according to claim 32, wherein the steps of the method are performed between a write and a read operation.

39. The method according to claim 32, wherein the steps of the method are performed between consecutive write operations.

40. A method of biasing a nonvolatile memory array during a read operation, the method comprising the steps of:

biasing a first plurality of electrically conductive traces at a first bias potential, each trace of the first plurality of traces being aligned in a first direction on a substrate;

biasing a selected trace of a second plurality of conductive traces at a second bias potential, each trace of the second plurality of traces being aligned in a second direction of the substrate, the second direction being different from the first direction, a difference in potential between the first bias potential and the second bias potential being about 1 V, and the second bias potential being a circuit ground potential;

biasing all other traces of the second plurality of conductive traces at the first bias potential; and performing a read operation on at least one memory cell coupled to the selected trace of the second plurality of conductive traces.

41. The method according to claim 40, wherein the memory array includes only the first and second plurality of traces.

42. The method according to claim 40, wherein the step of performing the read operation includes the step of measuring a current flowing between the first and second plurality of traces.

43. The method according to claim 40, wherein a plurality of memory cells are formed between the first and second pluralities of traces, each memory cell being located at an intersection region between one of the first plurality of traces and one of the second plurality of traces, each memory cell including a bidirectionally conducting nonlinear resistance selection device, and a magneto-resistive element electrically coupled in series with the selection device.

* * * * *